(12) United States Patent
Sjursen

(10) Patent No.: US 6,292,571 B1
(45) Date of Patent: Sep. 18, 2001

(54) HEARING AID DIGITAL FILTER

(75) Inventor: Walter P. Sjursen, Washington Crossing, PA (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/324,128

(22) Filed: Jun. 2, 1999

(51) Int. Cl.[7] .................................................. H04R 25/00
(52) U.S. Cl. ........................ 381/312; 381/316; 381/71.12; 381/94.1
(58) Field of Search ............................ 381/71.11, 71.12, 381/94.1, 316, 312, 320, 321; 708/322

(56) References Cited

U.S. PATENT DOCUMENTS

| | | | |
|---|---|---|---|
| 4,185,168 | 1/1980 | Graupe et al. ........................... | 179/1 |
| 4,548,082 | 10/1985 | Engebretson et al. .................. | 73/585 |
| 4,791,672 | 12/1988 | Nunley et al. ....................... | 381/68.2 |
| 4,803,732 | 2/1989 | Dillon ................................. | 381/68.2 |
| 4,809,332 | 2/1989 | Jongman et al. ....................... | 381/43 |
| 4,813,076 | 3/1989 | Miller ..................................... | 381/43 |
| 4,820,059 | 4/1989 | Miller et al. ............................ | 381/43 |
| 5,016,280 | 5/1991 | Engebretson et al. .................. | 381/68 |
| 5,111,419 | 5/1992 | Morley, Jr. et al. ............. | 364/724.19 |
| 5,225,836 | 7/1993 | Morley, Jr. et al. .................. | 341/150 |
| 5,259,033 | 11/1993 | Goodings et al. ...................... | 381/68 |
| 5,355,329 | 10/1994 | Lyon ............................... | 364/724.17 |
| 5,357,251 | 10/1994 | Morley, Jr. et al. .................. | 341/172 |
| 5,396,560 | 3/1995 | Arcos et al. ............................ | 381/68 |
| 5,402,493 | 3/1995 | Goldstein ............................ | 381/68.2 |
| 5,412,735 | 5/1995 | Engebretson et al. .................. | 381/94 |
| 5,475,759 | * 12/1995 | Engebretson .......................... | 381/312 |
| 5,500,902 | 3/1996 | Stockham, Jr. et al. ............. | 381/68.4 |
| 5,651,071 | * 7/1997 | Lindemann et al. .................. | 381/314 |
| 5,774,564 | * 6/1998 | Eguchi et al. ..................... | 381/71.11 |
| 5,777,914 | 7/1998 | Larsson et al. .................. | 364/724.19 |
| 5,794,187 | 8/1998 | Franklin et al. ....................... | 704/225 |
| 6,097,824 | * 8/2000 | Lindemann et al. .................. | 381/315 |

FOREIGN PATENT DOCUMENTS

| | | |
|---|---|---|
| 10294996 A | 11/1998 | (JP) . |
| 10294997 A | 11/1998 | (JP) . |
| 10304277 A | 11/1998 | (JP) . |
| 11098598 A | 4/1999 | (JP) . |
| 11098599 A | 4/1999 | (JP) . |
| 11104165 A | 4/1999 | (JP) . |
| 11113096 A | 4/1999 | (JP) . |

OTHER PUBLICATIONS

Peled, A. and Liu, B., *Design of Digital Filters*, John Wiley & Sons, Inc., NY, 1976, pp. 88–98.

(List continued on next page.)

*Primary Examiner*—Sinh Tran
*Assistant Examiner*—Suhan Ni
(74) *Attorney, Agent, or Firm*—Hamilton, Brook, Smith & Reynolds, P.C.

(57) ABSTRACT

A digital hearing aid uses a digital filter using coefficient multipliers and with digital signal processing algorithms, which can be implemented with a minimum amount of dedicated circuitry, which may be contained in an integrated circuit. Power consumption in the digital hearing aid is kept to a minimum by the use of a single, general purpose multiplier by eliminating a multiplexed multiplier, and by eliminating a plurality of general purpose multipliers. Preferably, filter coefficients which are limited to powers of 2 are used in the digital filter, whereby coefficient multipliers function as shifters. Shifting-hardware is simpler and more economical compared to a multiplier. Multiplication by powers of 2 is implemented by circuit connections in the hearing aid circuitry, without requiring any power expenditure from the battery. The digital filter may be a non-recursive finite impulse response (FIR) digital filter, or, an infinite impulse response (IIR) digital filter.

3 Claims, 11 Drawing Sheets

OTHER PUBLICATIONS

Higgins, R., *Digital Signal Processing in VISI*, Prentice Hall, Englewood Cliffs, NJ, 1990, pp. 182–191.

Dempster, AG and Macleod, MD, "IIR Digital Filter Design using Minimum Adder Multiplier Blocks", IEEE Transactions on Circuits and Systems II, Analog and Digital Signal Processing, vol. 45, No. 6, 6/98, pp. 791–763.

Steiglitz, K., *An Introduction to Discrete Systems*, John Wiley & Sons, Inc., NY 1974, pp. 77–88.

Killion, M.C., et al., "Classifying automatic signal processors", *Hearing Instruments*, 41(8):pp. 63–70, pp. 139–142 (1990).

Liu, C., et al., "Simulation of fixed microphone arrays for directional hearing aids", *J. Acoust. Soc. Am.*, 100(2):pp. 848–857 (1996).

Wang, A., et al., "Modern Microphone Array for Hearing Aid and Speech Processing", *SPIE*, 2846:pp. 112–121.

Nielsen L., et al., "An 85MUW Asynchronous Filter–Bank for a Digital Hearing Aid," IEEE International Solid State Circuits Conference, US, IEEE Inc., New York, vol. 41, pp. 108–109 XP000862106, ISSN: 0193–6530.

Bursky, D., "Adaptive and Flexible Digital Filter Minimizes Programming and Cost," Electronic Design, US, Penton Publishing, Cleveland, OH, vol. 35, NR. 27 pp. 65,67 XP000045087, ISSN: 0013–4872.

* cited by examiner

HEARING AID DIGITAL FILTER

BACKGROUND OF THE INVENTION

This invention generally relates to hearing aid digital filters, and more particularly, is directed to a hearing aid digital filter with reduced power consumption and dissipation.

Digital Signal Processors (DSP), which are known to be used in hearing aid systems hitherto, have emphasized speed and performance, and have been traditionally of a design which requires significant amounts of power. Significant power consumption in DSPs is basically because of the components and the manner of interconnection thereof.

The present invention is directed to a DSP for a hearing aid where the power consumption is minimized with consequent advantages of economy and size without sacrificing performance.

In a conventional hearing aid, a microphone converts incident sound waves into an analog electrical signal which is then processed to filter out unwanted noise etc., amplified, and coupled to a receiver or speaker which converts the electrical signal back to sound waves. The electrical signal processor may be an analog processor which operates directly upon an analog electrical signal. Alternatively, the analog signal may be converted to a digital signal and processed by a digital signal processor (DSP).

Most hearing aids now-a-days use analog signal processing. Signal processing schemes include frequency-independent linear amplification, frequency-compensated linear amplification (typically boosting the high frequencies), frequency-independent automatic gain control (AGC) systems, and finally signal level dependent, frequency compensated systems. This final class of hearing aids includes signal processing algorithms that the hearing aid community labels 2-channel systems, 3-channel systems, and multi-channel systems. These systems split the audio frequency band up into two or more sections and can control the gain of each section independently from one another. The K-Amps® circuits from Etymotic Research and the DynamEQ-I® circuits from Gennum Corporation are examples of traditional 2-channel systems.

The DynamEQ-I® has two amplifier sections, one processes the low frequencies and the other processes the high frequencies. This, in the traditional sense, is a two-channel system. The K-Amp contains only one amplifier to shape the frequency response as a function of input level. Both of these circuits implement a first order analog filter although in different ways. Therefore, one must be careful when using the term 2-channel system. A description of the complex-frequency transfer function (written in the s-domain) is a more appropriate way to describe analog filters.

The accuracy and repeatability of analog filters depend on the tolerances of physical components (e.g., resistors and capacitors). These components have initial tolerances, which vary with temperature, and can also vary with humidity, voltage, and age. It can be quite a challenge to design an analog filter to meet its intended requirements when operating over a range of environmental conditions.

Digital filters on the other hand are implemented with digital electronics that manipulate numbers. Digital filters are described by algorithms, and are represented mathematically in the z-domain. The repeatability of the digital filter from circuit to circuit depends only on the accuracy of the sampling frequency. This sampling frequency is usually derived from a crystal-controlled oscillator with a typical accuracy of 0.01 percent. The precision of the oscillator frequency is much better than the typical 1%, 5%, and 10% tolerances of resistors and capacitors used in analog filters. The accuracy, distortion, and noise characteristics of the digital filter depend on the precision with which the signal and filter coefficients are represented.

There exist several prior art US patents which relate to hearing aid technology.

U.S. Pat. No. 4,803,732, entitled Hearing Aid Amplification Method and Apparatus, to Dillon, recognizes different audiofrequency bands and handles them independently. The different frequency bands are independently amplified to match the needs and loss pattern of hearing of the user. Prior to amplification, the microphone signal is passed through an optional filter. Thus, signal discrimination for the user is increased.

U.S. Pat. No. 4,791,672 to Nunley et al is directed to a hearing aid which includes a wearable, programmable digital signal processor for processing digital samples of analog signals in real time. A hearing aid program stored in a signal processor is continuously executed, introducing noise suppression.

Prior art is replete with US patents which are, in one way or the other, directed to noise suppression in different degrees, using different arrangements or techniques. Examples of such prior art include US patents: U.S. Pat. No. 5,794,187 to Franklin, et al., U.S. Pat. No. 5,651,071 to Lindemann, et al., U.S. Pat. No. 4,185,168 to Graupe, et al., U.S. Pat. No. 5,306,560 to Arcos, et al., 5,259,033 to Goodings, et al, and U.S. Pat. No. 5,412,735 to Engebretson, et al. Generally, the aforesaid patents are directed to achieving clarity of hearing or enhanced hearing for the user without any reference to the power consumed in the amplifier and associated circuitry.

A general method for describing the action of a digital filter on a digital signal is the Z-transform method.

Z-Transform

A brief discussion of the Z-transform at this juncture is believed to assist in providing a better understanding of the invention.

Let $X(k)$ be a digital signal that is zero for $k<0$. Its z-transform, denoted by $X*(z)$, is defined to be the function of z:

$$X*(z) = X(0) + X(1)z^{-1} + X(2)z^{-2} + \ldots$$

$$= \sum_{k=0}^{\infty} X(k)z^{-k}$$

Because of the shift-multiplication property which is being aimed for, z will have the same interpretation as does a phasor approach. That is, when z is on the unit circle in the complex z-plane, its angle is interpreted as a frequency variable. But the question is not how is z interpreted, but rather how is z defined. The answer is: z is an independent complex variable. It has much the same status as k, the sample number. A signal is defined to be a function of k, while its z-transform is defined to be a function of z. Thus, z is the domain of the z-transform of a signal. In fact, the z-transform can be looked at as a transformation from the time domain to the frequency domain. The following symbolism may be used for the z-transform:

$$F(k) \xrightarrow{z} F*(z)$$

The symbol over the arrow indicates the name of the transformation. It is noted at this point that a digital filter can be thought of as a transformation in the same way as the z-transform. For example, if X is the input filter to a filter H and Y is the output, a relationship can be expressed as:

$$X(k) \xrightarrow{H} Y(k)$$

Thus, a filter is a transformation that converts one function of k to another function of k, while the z-transform converts one function of k to another function of z.

Z-transforms have certain properties which make it possible to represent moving average filters and other linear time-invariant filters by multiplication, similar to an approach which deals with phasors. For a one-sided digital input signal, the z-transform of the output signal can be obtained by multiplying the z-transform of the input signal by the transfer function H(z).

Z-transforms have a property which enables easy and free movement from the time domain to the frequency domain. Filtering in the time domain can be looked at as corresponding to multiplication in the z-transform domain. A more complete understanding of the above can be had from *An Introduction to Discrete Systems* by Kenneth Steglitz, Princeton University, John Wiley & Sons, Inc. 1974.

Filter Coefficients:

A digital filter is characterized by a set of real numbers, namely its coefficients. Altering these numbers will alter the characteristics of the filter. To assess the effect of any change in the value of a coefficient on a given filter characteristic, say the frequency response, one may differentiate $|H(e^{jwt})|$ with respect to that coefficient and use of the value of the derivative as an indication of the sensitivity of the frequency response to changes in the particular coefficient. A more detailed analysis of the choice of coefficients on the filter characteristic can be found in chapter 2, *Design of Digital Filters*, p. 45 of *Digital Signal Processing* by Abraham Peled and Bede Liu.

A digital filter H(f) may be expressed as a Fourier series:

$$H(f) = \sum_{k=0}^{N-1} h(n)e^{j2\pi nf},$$

analysis of phase shifts of a symmetric Finite Impulse Response (FIR) as influenced by the choice of the filter coefficient h(n) is given in *Digital Signal Processing in VLSI* by R. Higgins, pp. 182–191, Prentice Hall, Englewood Cliffs, N.J., 1990.

The choice of the filter coefficients h(n) which are the z-transform of H(z) in the frequency domain and the time domain significantly influence the filter characteristics.

A detailed analysis of the design considerations in designing digital filters, especially from the point of view of the choice of multiplier coefficients can be found in the publication *IIR Digital Filter Design using Minimum Adder Multiplier Blocks* by A. G. Dempster and M. D. Macleod in *IEEE Transactions on Circuits and Systems-IT Analog and Digital Signal Processing*, vol. 45, no. 6, pp. 761–763, June 1998. The publication describes details of how specific values chosen for the multiplier coefficients influence the performance of the filter. The publication also explains how the coefficient word length (i.e., the number of bits) required for a digital filter is related to the coefficient sensitivities, and states that different filter structures can require widely different word lengths to meet a required filter specification. A reference is made in the publication to the high cost of coefficient multipliers.

General purpose digital signal processors are available. Motorola, Texas Instruments, and Analog Devices are three examples of manufacturers of these devices. The goal of these processors is to be fast and flexible so that a large number of different types of signal processing can be implemented. The penalty to be paid for this speed and flexibility is power and the size of the integrated circuit. Also, these devices have traditionally operated on a +5 volt supply. The trend is towards lower operating voltages and presently there are several devices that operate on +3.3 volts. The power source for a hearing aid is generally a zinc-air battery that provides +1.3 volts. The end-of-life voltage for the zinc-air cells is usually specified as +0.9 volts, +1.0 volts, or +1.1 volts depending on the manufacturer. Hearing aid integrated circuits are typically specified to operate within specifications down to +1.1 volts. To use digital signal processing in a hearing aid, then requires the DSP chip to operate down to at least +1.1 volts, and preferably +1.0 volts. To maximize battery life, the current drain needs to be very low. For example, in order for a 675-cell, rated at 550 mAh to last for 31 days continuously (24 hours per day), the average current drain on the battery must be no greater than 740 $\mu$A (0.74 mA). This current includes the current for the microphone, the analog-to-digital converter (ADC), digital signal processing circuitry (DSP), digital-to-analog converter (DAC), audio power amplifier, and receiver (speaker). To conserve battery current, the audio power amplifier may be implemented as a class-D amplifier. Knowles Electronics offers several receivers with built-in class-D amplifiers. A Knowles electret microphone consumes an average current of about 20 $\mu$A, while the class-D amplifier and receiver consume an average current of about 550 $\mu$A depending on signal level. This leaves about 170 $\mu$A of current available for the remainder of the electronics (ADC, DSP, and DAC). Another attempt to conserve power is to eliminate the conversion from digital back to analog, and rather use a digital-to-digital converter (as in the Widex Sensot® digital hearing aid, for example). This digital-to-digital converter (DDC) drives the receiver in a class-D scheme, but uses the digital words to directly control the duty-cycle of the signal applied to the receiver.

General purpose DSP chips provide an architecture that is flexible. A generic DSP device consists of various functional blocks including accumulators, adder/subtractors, multipliers, registers, data memory, and program memory. These functional blocks are multiplexed to minimize the number of blocks needed. When two numbers need to be multiplied, the numbers are fetched from memory and latched into the input registers of the multiplier. The output of the multiplier contains the result, which is then stored in another register or in memory.

SUMMARY OF THE INVENTION

The present invention uses a digital filter and achieves minimized power consumption with the attendant advantages of low cost and smallness in size without significantly sacrificing performance.

It is the object of this invention to provide a hearing aid using a digital filter where power consumption is minimized, thus resulting in size advantage and cost economy. In one form, the invention resides in a digital signal processor for a hearing aid of the type using a signal level dependent frequency compensated system within a digital filter, comprising a general purpose multiplier to control frequency response as a function of a predetermined e.g., input signal level, and an infinite impulse response digital filter (IIR) used as a digital filter, said digital filter having filter coefficients which are generically related to $2^n$, n being an integer, thereby minimizing power consumption in the digital signal processor.

In a second form, the invention provides a digital signal processor for a hearing aid of the type using a signal level dependent frequency compensated system within a digital filter, comprising a general purpose multiplier to control frequency response as a function of a predetermined parameter, e.g., input signal level, and a non-recursive finite impulse response digital filter used as a digital filter, said digital filter having filter coefficients which are generically related to $2^n$, n being an integer, thereby minimizing power consumption in the digital signal processor.

This invention concentrates on minimizing the power consumption of the DSP algorithm portion of a digital hearing aid by using signal processing algorithms that can be implemented in a minimum amount of dedicated circuitry. This circuitry would normally be contained within an integrated circuit. In a first preferred embodiment of the invention, circuitry is minimized in three ways: First, only one general purpose multiplier is used to change the frequency response as a function of signal level, second, the filter coefficients are values represented by 2 raised to the nth power, and third, a non-recursive (finite impulse response) filter is used.

Only one general purpose multiplier: In the present invention, a single general purpose multiplier is used, and the coefficients are fixed and limited to figures relating to powers of 2; the coefficient multipliers become shifters if the coefficients are values which can be represented as $2^n$. In this invention, a coefficient multiplier functions as a shifter rather than a multiplier. The shifter function does not need consumption of additional amounts of power expenditure, unlike in the case of a coefficient multiplier. Since general purpose multipliers require more circuitry than other functional blocks such as adders, it is desirable to minimize the number of such multipliers. If many general purpose multipliers are needed, a multiplexed multiplier, such as that used in DSP devices, makes more sense. However, if only one general purpose multiplier is needed, a dedicated multiplier may be use&, and the multiplexing circuitry is eliminated. Accordingly, in this invention only one general purpose multiplier is employed.

Filter coefficients with values of powers of two: In digital filters, as aforesaid, the filter coefficients are selected to achieve the desired filter characteristics. These coefficients are multiplied with time-delayed data values. Normally, this is performed with a general purpose multiplier. By constraining the filter coefficients to powers of 2, the multiplier becomes a simple shifter. lifting hardware is simpler to implement than multipliers. However, since this invention provides only a dedicated signal processing function, the coefficients are fixed and the multiplier is implemented merely by routing the correct bits to their destinations. It will be shown below that filters with the needed characteristics can be achieved with coefficients constrained to powers of two. In another implementation of the invention, the filter coefficients are not, per se, powers of 2, but rather the sum of two numbers, both of which are powers of two. To implement the multiplication needed, the data signal is shifted, then added (or subtracted) from the unshifted signal. Only a single adder is required to achieve the multiplication needed. Multiplications by powers of 2 are implemented by the circuit connections and do not require any hardware, and hence do not use any power from the battery.

Use of non-recursive filter: Non-recursive or finite impulse-response (FIR) filters have several advantages over recursive or infinite impulse-response (IIR) filters. FIR filters do not have poles and hence are unconditionally stable. The IIR filters do have poles and therefore can become unstable and oscillate. FIR filters do not accumulate errors since only a finite number of past input samples are used. The IIR filters on the other hand, use a finite number of past input samples and past output samples. Therefore, errors can accumulate, and limit-cycle oscillations may become a problem. Whereas 16-bits may be adequate for FIR filters, 24-bits may be needed in IIR filters to handle truncation and round-off errors. Although the description for the preferred embodiment of this invention uses FIR filters, the invention may also be implemented with IIR filters.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

While this invention has been particularly shown and described with references to preferred embodiments thereof, it will be understood by those skilled in the art that various changes in form and details may be made therein without departing from the spirit and scope of the invention as defined by the appended claims.

In accordance with the invention, a generic digital signal processing algorithm that is suitable for use in low-voltage, low-power hearing aid applications is described herein. The preferred embodiment may be structured, depending on the desired signal processing. Several embodiments of the invention will be described and will illustrate the inherent features of the invention.

Digital signal processing algorithm: Within the constraints outlined above, this invention provides the generic digital signal processing algorithm described by the following system function equation in the z-domain:

$$\text{Transfer Function } H(z) = \sigma \cdot z^{-\delta} + \lambda \cdot [2^{-\gamma} \cdot \sigma \cdot z^{-\delta} + G(z)] \quad (1)$$

where $$G(z) = a_0 + a_1 \cdot z^{-1} + a_2 \cdot z^{-2} + a_3 \cdot z^{-3} + \ldots + a_n \cdot z^{-n} \quad (2)$$

where $z^{-1}$ is a unit delay, $a_0 \ldots a_n$ are the filter coefficients, and $G(z)$ is a FIR filter. The parameter $\sigma$ takes on a constant value of either +1 or −1 depending on the actual filter being implemented, and $\delta$ defines an output tap of the delay line. The parameter $\gamma$ defines the low frequency response, and $\lambda$ is a parameter that controls the signal level-dependent frequency response. In the hearing aid application, $\lambda$ will be controlled by the level of one of several signals such as: (1) the input signal, (2) the output signal, (3) the signal at the input to the $\lambda$-multiplier, or the signal at the output of the $\lambda$-multiplier.

Figure 1:
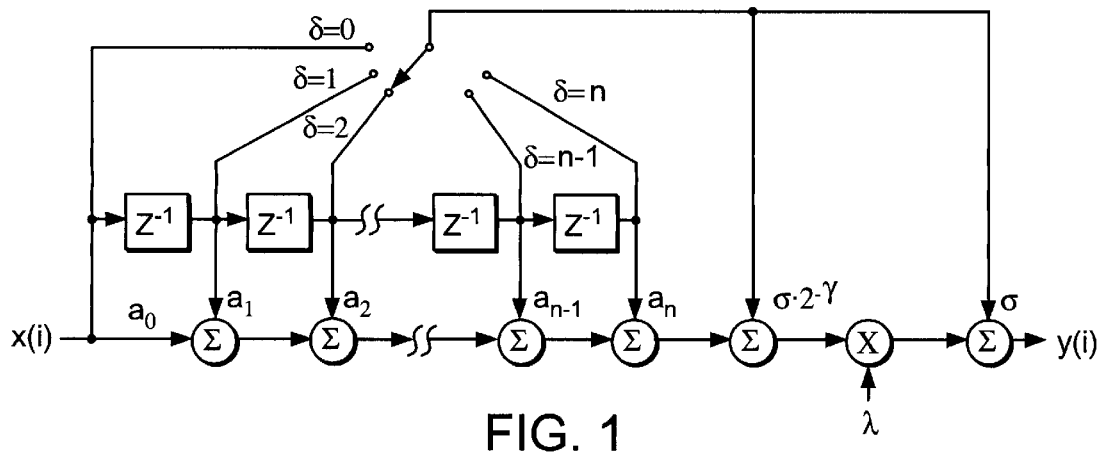
FIG. 1 is a generic block diagram for the digital signal processor of the invention.

FIG. 1 is a generic signal processing block diagram of the invention. It shows a circuit schematic of a digital filter where x(i) shows the input and y(i) shows the signal after passing through the filter. $Z^{-1}$ is a unit delay, and $a_0, a_1, a_2, \ldots a_n$ are the filter coefficients which are used to multiply with a corresponding one unit delay, two unit delay, etc., up to a n unit delay $Z^{-n}$ as per equation 2. The schematic shows $\lambda$, which is a parameter that controls the signal level-dependent frequency response. As aforesaid, $\lambda$ can be controlled by the level of one of several signals such as the input signal, or the signal to the input to the $\lambda$ multiplier or the signal at the output of the $\lambda$ multiplier. $\delta$ shows the different selectable taps to obtain different levels of delay. The parameters $\sigma$, as aforesaid in the context of equation 1, takes on a constant value of either +1 or −1, depending on the actual filter being implemented.

Figure 2:
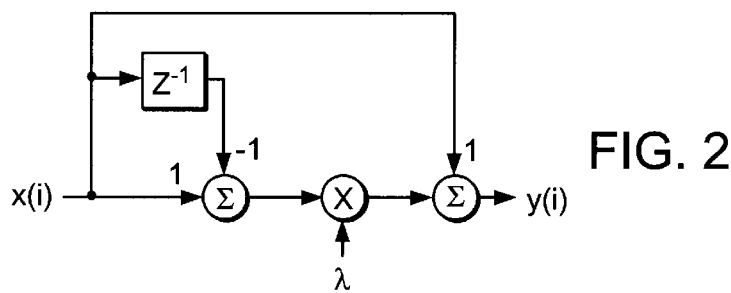
FIG. 2 is a block diagram of a first order filter with no low frequency boost.
Figure 3:
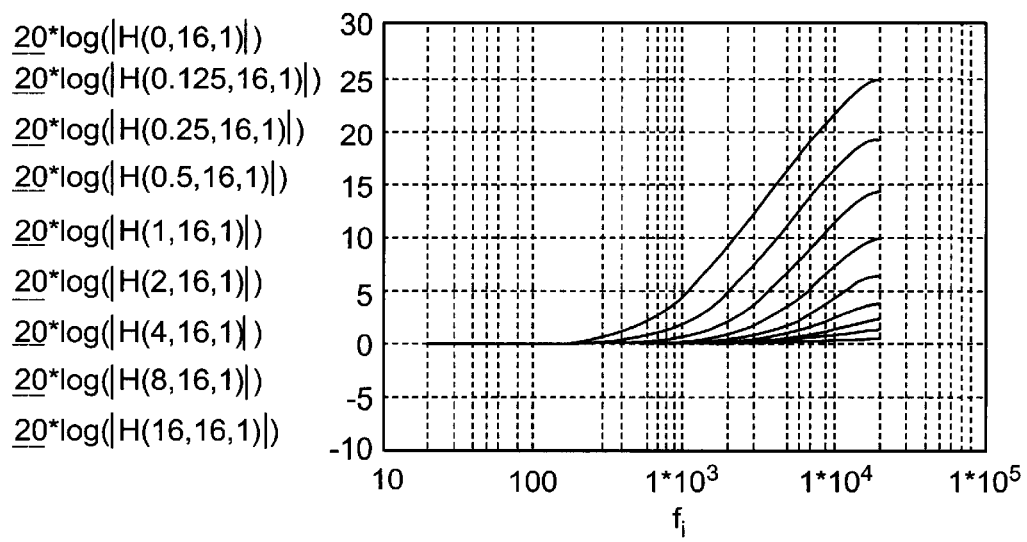
FIG. 3 is a plot of frequency response for a filter of FIG. 2 at various λs.

First order filter with no low-frequency gain: FIG. 2 shows the block diagram of a first order implementation of the invention. There is no low-frequency gain ($\gamma = \infty$). With $\lambda = 0$, the frequency response is flat. As $\lambda$ is increased, the high frequencies are boosted. The maximum rate of high frequency boost is 6 dB per octave. FIG. 3 shows the frequency responses for $\lambda$ ranging from 0 to 32. The sampling rate is 40,000 samples per second.

Figure 4:
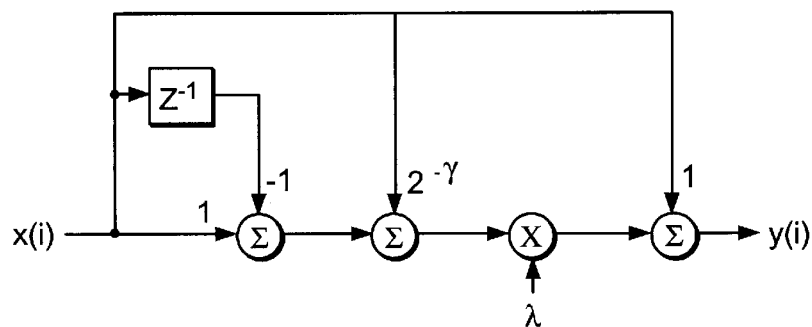
FIG. 4 is a block diagram of a first order filter with low frequency boost.
Figure 5:
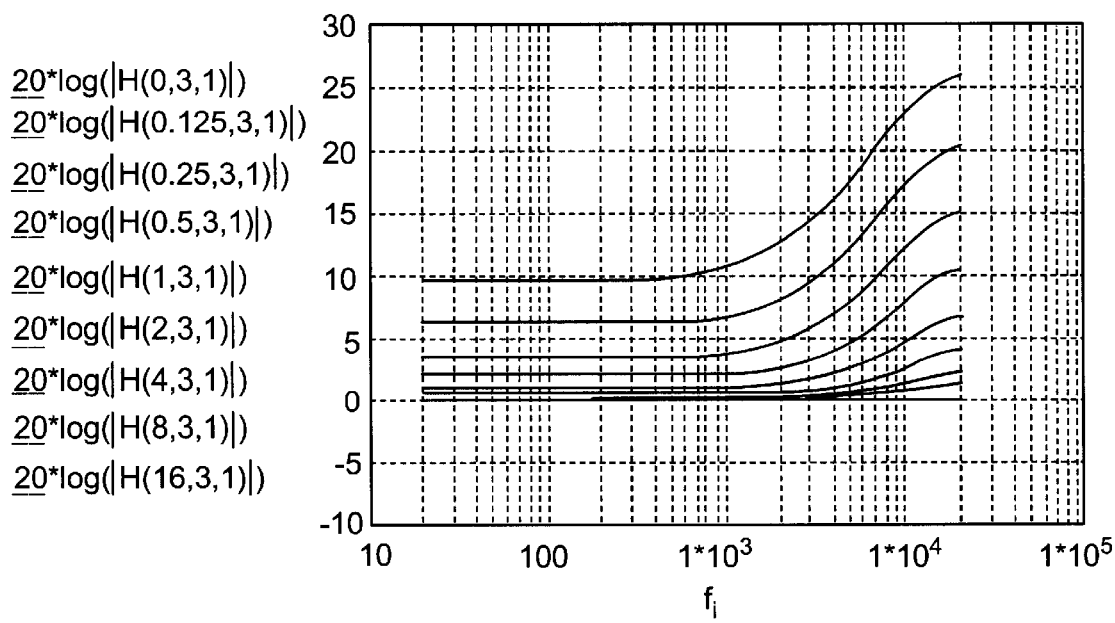
FIG. 5 is a plot of frequency response for the filter of FIG. 4 at various λs.

First order filter with low-frequency gain: FIG. 4 shows the block diagram of a first order implementation of the invention. The low-frequency gain is controlled by the $\gamma$ parameter. With $\lambda = 0$, the frequency response is flat. As $\lambda$ is increased, both high and low frequencies are boosted. However, the low frequencies are boosted less than the high frequencies. The amount of low frequency boost is affected by both $\gamma$ and $\lambda$ parameters. The maximum rate of high frequency boost is 6 dB per octave. FIG. 5 shows the frequency responses for $\gamma = 4$ and $\lambda$ ranging from 0 to 32. The sampling rate is 40,000 samples per second.

Figure 6:
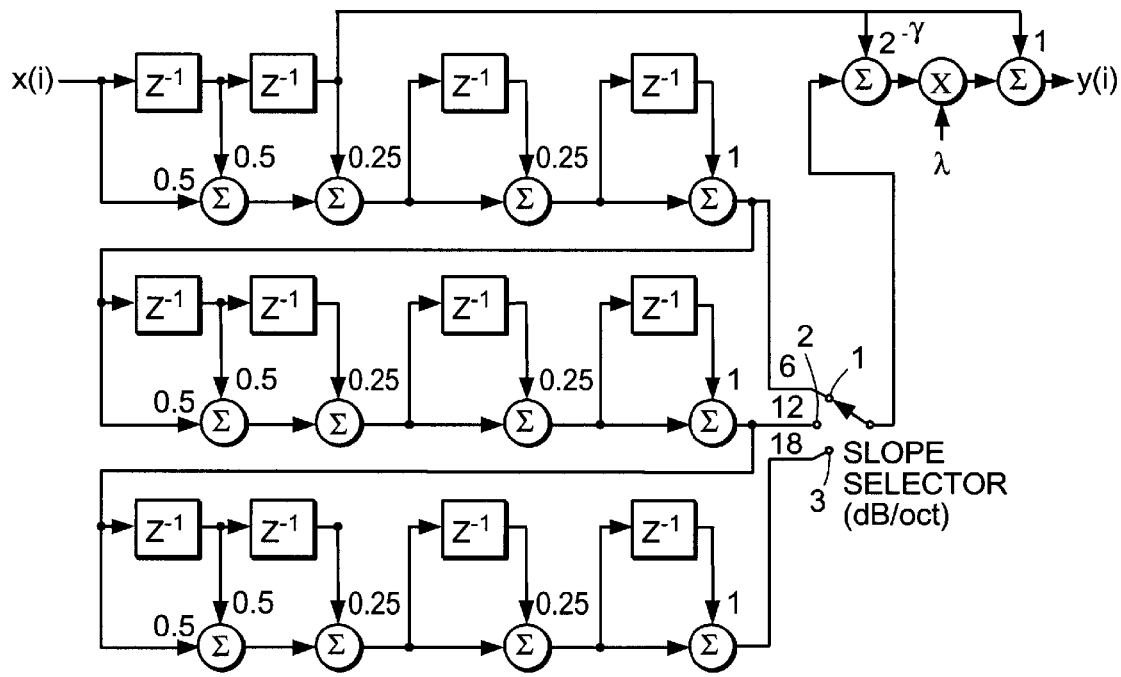
FIG. 6 is a block diagram of a first preferred embodiment of the invention.

In hearing aid applications, filters with 6, 12, and 18 dB per octave slopes are often needed. To achieve this, the filter configuration of FIG. 6 provides an easily selectable slope, uses only one generic multiplier, and has filter coefficients of powers of two. With such data, signal processing can be expressed as follows:

$$\text{Transfer function } H(z) = z^{-2} + \lambda \cdot [2^{-\gamma} \cdot z^{-2} + G(z)^s] \quad (3)$$

$$\text{Filter } G(z) = (0.5 + 0.5 \cdot z^{-1} + 0.125 \cdot z^{-2}) \cdot (1 + 0.25 \cdot z^{-1}) \cdot (1 - z^{-1}) \quad (4)$$

where $\lambda$ is a level-dependent gain parameter, $\gamma$ controls the amount of low frequency amplification, and s=1, 2, or 3 and selects a slope of 6, 12, or 18 dB per octave. It should be noted that the digital filter G(z) is implemented using filter coefficients that are only powers of two. However, G(z) may be rearranged as follows:

$$G(z) = 0.5 + 0.125 \cdot z^{-1} - 0.375 \cdot z^{-2} - 0.21875 \cdot z^{-3} - 0.03125 \cdot z^4 \quad (5)$$

Equations 4 and 5 are equivalent, even though the coefficients in equation 5 are not all powers of two. This does not violate the spirit of the invention, since the filter was implemented with coefficients of powers of two (equation 4). The filter G(z) was also selected to have a peak gain of close to 1 (ideally it would be one), such that the peak gain of G(z) raised to the power s (equation 3), also has a peak gain of about one. A user programmable hearing aid can then be implemented with selectable slopes of 6, 12, or 18 dB/oct, while maintaining the same maximum gain.

An estimate of the power dissipation for this preferred embodiment will now be made based on the block diagram of FIG. 6. First an estimate of gate count is made for each functional element: delay register, adder, and multiplier. It is assumed that the width of the data is 20 bits. Gate counts are made based on the gate counts of similar CD4000 series CMOS logic parts as follows:

Delay register—based on a CD4174 hex type D flip-flop. The CD4174 has an equivalent gate count of 43.5 gates, or 7.25 gates per bit. A 20-bit register then has 145 gates.

Adder—based on a CD4008 4-bit full adder. The CD4008 has an equivalent gate count of 40 gates. Therefore a 20-bit adder has 200 gates.

Multiplier—based on an array multiplier [A. Peled and B. Liu, *Digital Signal Processing, Theory, Design, and Implementation*, John Wiley & Sons Inc., New York, 1976; R. Higgins, *Digital Signal Processing in VLSI*, Prentice Hall, Englewood Cliffs, N.J., 1990], the number of equivalent gates for a n×m multiplier is estimated by $$gates = n \cdot m + 10 \cdot \left(2 \cdot \sum_{i=0}^{(m-2)} i + (n-m+1) \cdot (m-1) + 1\right) \quad (6)$$

where n and m are the number of bits for each of the multiplicands, n>m, and m≧2. Then, from equation (6), a 20-bit by 20-bit multiplier requires 4020 equivalent gates.

The rough order-of-magnitude gate count of the digital filter shown in FIG. 6 can now be made as follows:

| Element | Gates | Quantity | Total gates |
|---|---|---|---|
| Delay register | 145 | 12 | 1740 |
| Adder | 200 | 14 | 2800 |
| Multiplier | 4020 | 1 | 4020 |
| | | | 8560 |

To estimate the power dissipation, an estimate of the dissipation per gate is needed. Low-voltage, low power CMOS processes have achieved power dissipation figures of 0.05 µW/MHz/gate for 0.5-V MT CMOS [T. Douseki, S. Shigematsu, J. Yamada, M. Harada, H. Inokawa, and T. Tsuchia, A 0.5-VMTCMOS/SIMOX Logic Gate, *IEEE J. Solid-State Circuits*, vol. 32, no. 10, pp. 1604–1609, 1997]. Then for 1.3 volt operation, 0.34 µW/MHz/gate may be assumed. For the digital filter operating at a sampling rate of 40 kHz, the total power dissipation is given by $$P_{diss}=(0.34 \text{ µW/MHz/gate}) \cdot (0.04 \text{ MHz}) \cdot (8560 \text{ gates})=116.4 \text{ µW} \quad (7)$$

At a voltage of +1.3 volts, the battery current would be only 90 µA. Additional power savings can be obtained by using a more efficient multiplier, or using a lower sampling rate. For example, at a sampling rate of 32 kHz, the battery current would be 72 µA instead of 90 µA. If a 20×10 multiplier is used (20-bit data and 10-bit control signal), a savings of 2100 equivalent gates is achieved. At 1.3 V and a 40 kHz sampling rate, this results in a savings of 29 µW (22 µA), or 24 percent. Using a 20×10 multiplier, the currents become 68 µA (at 40 kHz sampling) and 54 µA (at 32 kHz sampling). As demonstrated, this filter configuration consumes very low power levels from the battery.

Frequency response of preferred embodiment: The frequency response of the preferred digital filter described by equation (3) depends on parameters $\lambda$, $\gamma$, and s. The $\lambda$ parameter controls the gain of the filter. The $\gamma$ parameter controls the low-frequency gain relative to the high-frequency gain. Finally, the s parameter selects a maximum nominal slope of 6, 12, or 18 dB/oct. FIGS. 7–15 show typical frequency responses that can be achieved by varying the different parameters.

Figure 7:
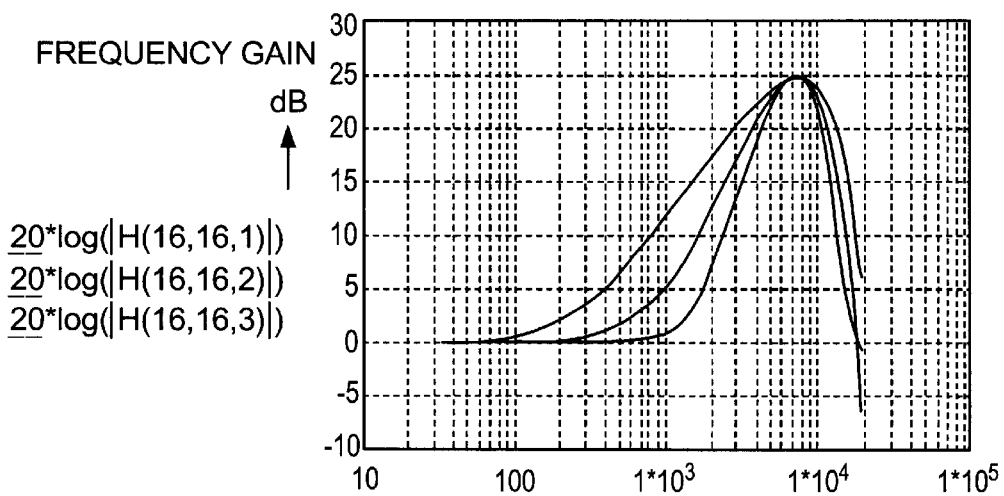
FIG. 7 is a set of frequency response curves in which the slope or s parameter is varied for the embodiment of FIG. 6.

FIG. 7 shows the effect of selecting different slopes. A family of frequency response curves for $\lambda=16$, $\gamma=16$, and s=1, 2, and 3 are shown. The peak gain is set by $\lambda$ and is about 24 dB regardless of the selected slope. The low frequency gain is 0 dB (i.e., unity gain) and is set by setting $\gamma$ to about 16 or greater. The gain above 7.5 kHz is reduced to minimize high-frequency noise for hearing aid applications.

Figure 8:
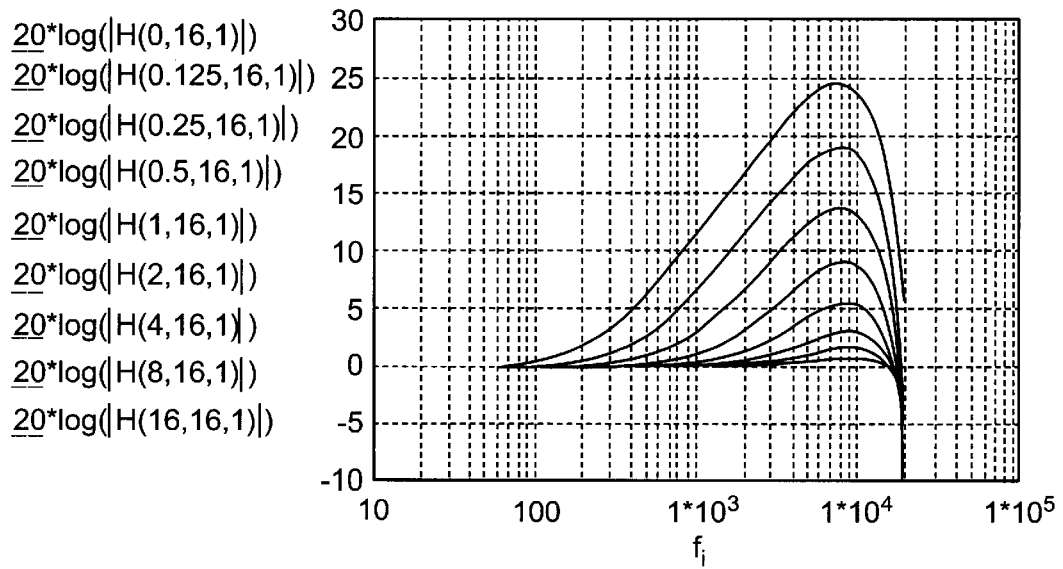
FIG. 8 is a plot of frequency response curves as in FIG. 7 where s=1, γ=16 and λ ranges from 0–16.

FIG. 8 shows a family of frequency response curves for s=1, $\gamma=16$, and $\lambda$ ranging from 0 to 16. For high-level signals (i.e., loud sounds), $\lambda$ would be driven towards zero and the frequency response becomes flat. For low-level signals (i.e., soft sounds), $\lambda$ increases towards 16 and the high frequency gain also increases. Since $\gamma$ is set to 16, there is no low-frequency amplification.

Figure 9:
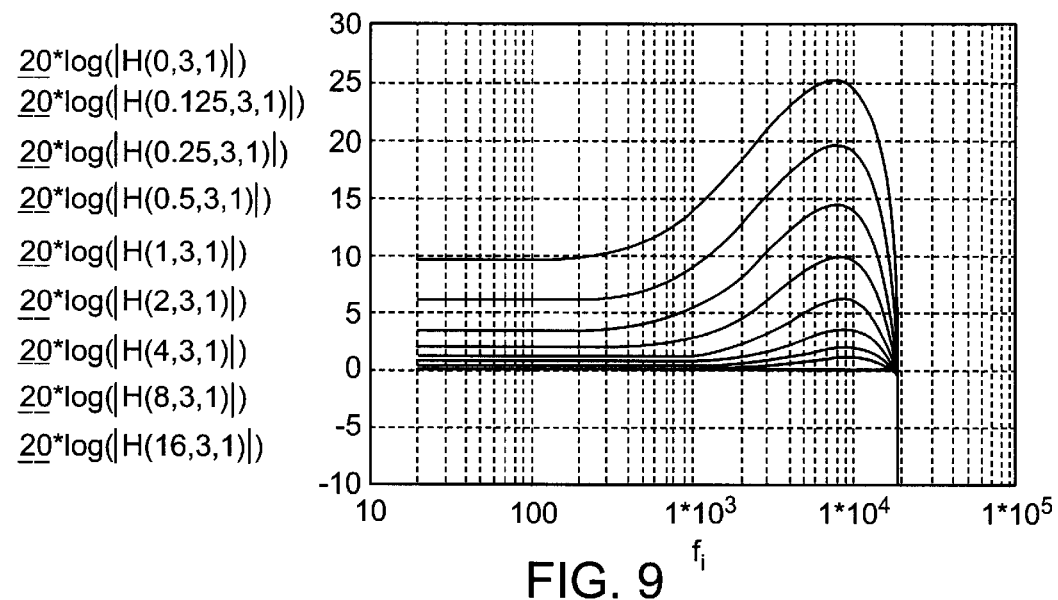
FIG. 9 is a plot as in FIG. 8 where y=3.

FIG. 9 shows the same filter used for FIG. 8 except that $\gamma=3$. Now as $\lambda$ increases towards 16, the gain at low frequencies also increases, although not as much as the gain at high-frequencies.

Figure 10:
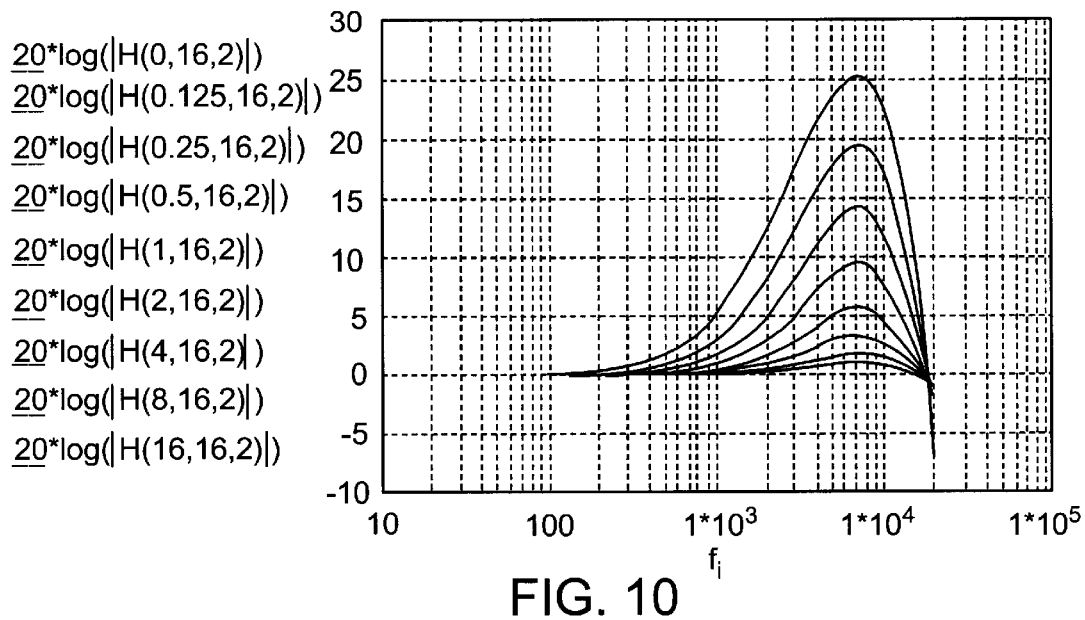
FIG. 10 is a plot as in FIG. 8 where s=2, γ=16 and λ=0 to 16.
Figure 11:
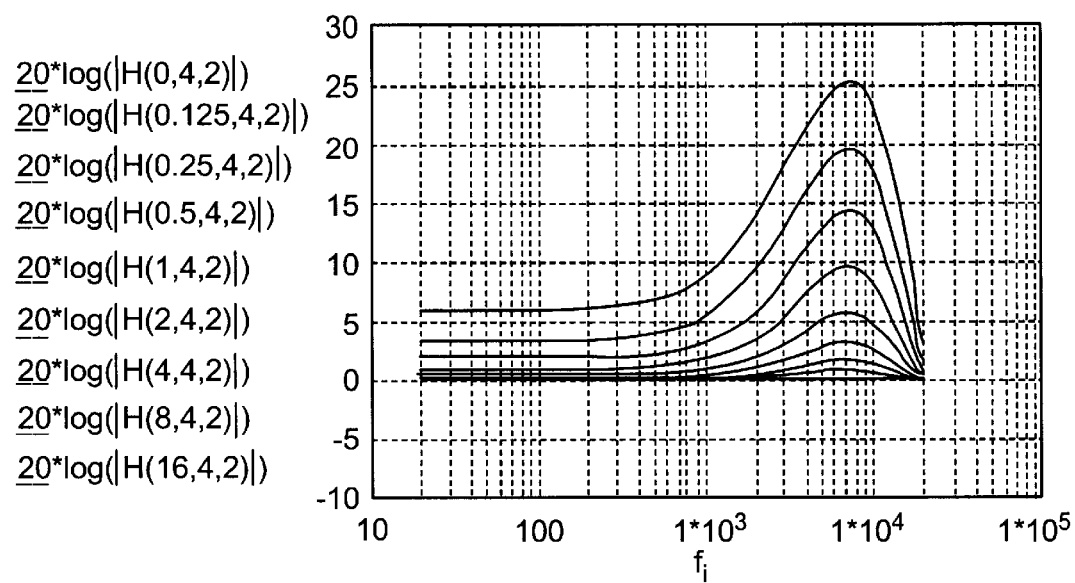
FIG. 11 is a plot as in FIG. 8 where s=2, γ=4 and λ=0 to 16.
Figure 12:
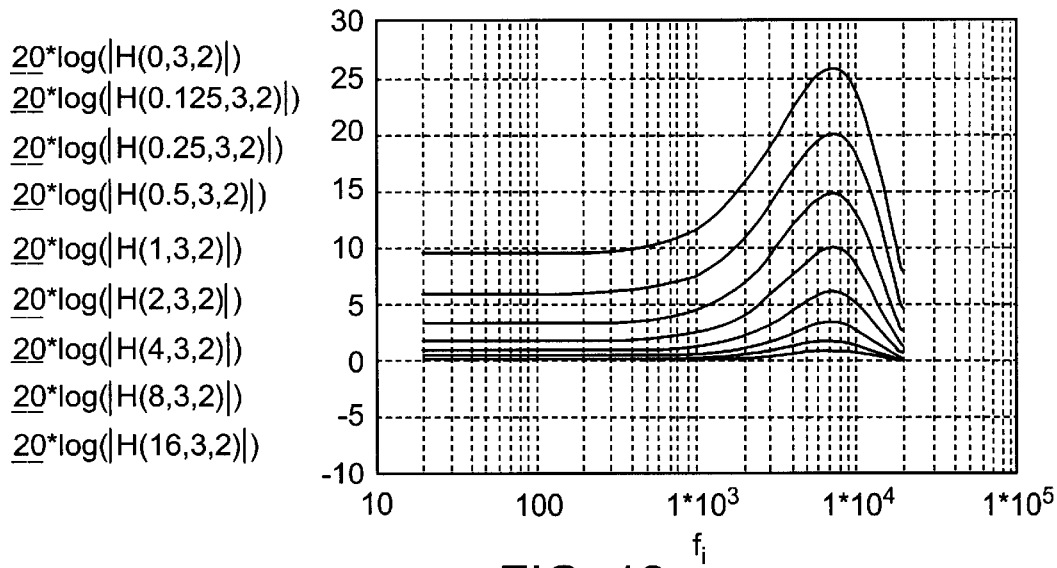
FIG. 12 is a plot as in FIG. 8 where s=2, γ=3 and λ=0 to 16.
Figure 13:
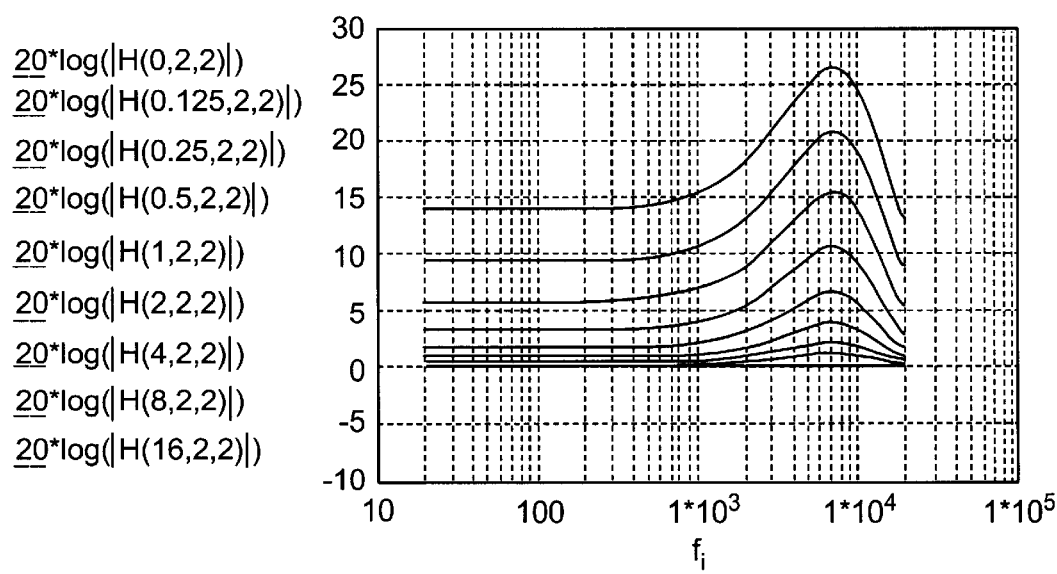
FIG. 13 is a plot as in FIG. 8 where s=2, γ=2 and λ=0 to 16.

FIGS. 10–13 show frequency response curves for a filter with s=2 and $\lambda$ ranging from 0 to 16. The different figures demonstrate the effect of varying y. In FIG. 10, $\gamma=16$, and there is no low-frequency gain. In FIG. 11, $\gamma=4$. In FIG. 12, $\gamma=3$. Finally in FIG. 13, $\gamma=2$. FIGS. 11–13 have low-frequency gain with the maximum low-frequency gain increasing in 6 dB steps as y goes from 4, to 3, to 2.

Figure 14:
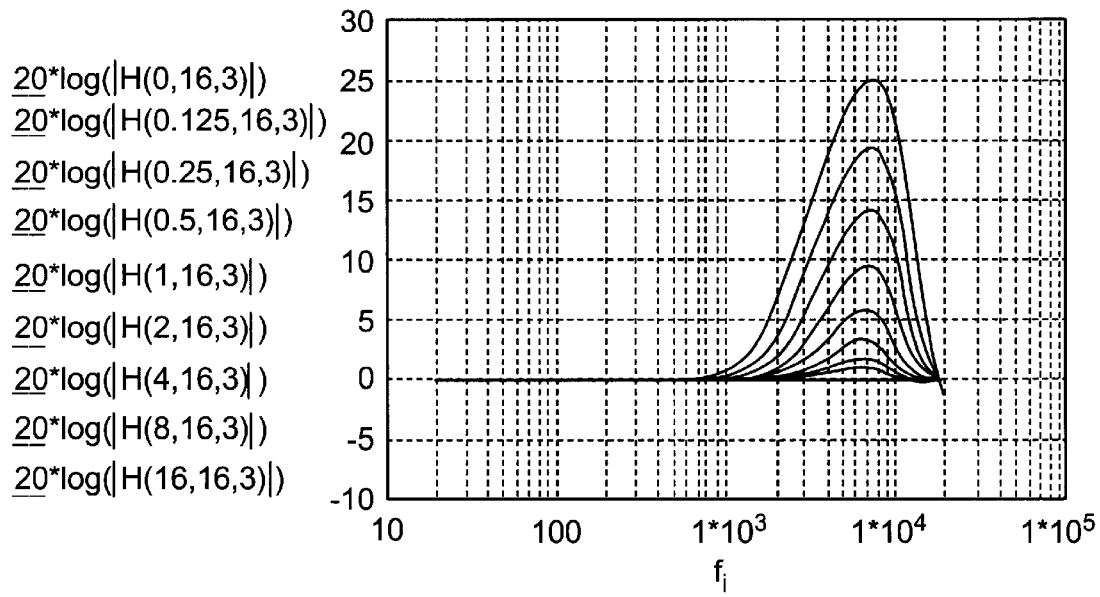
FIG. 14 is a set of frequency response curves for s=3, γ=16 and λ=0 to 16.
Figure 15:
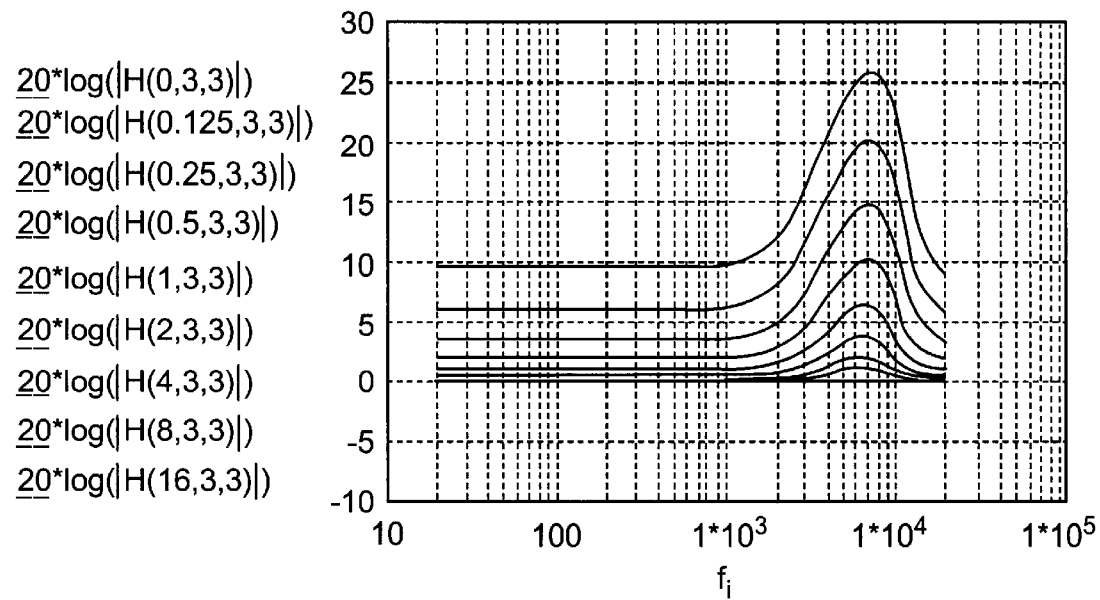
FIG. 15 is a set of frequency response curves for s=3, γ=3 and λ=0 to 16.

FIGS. 14 and 15 show frequency response curves for a filter with s=3 and $\lambda$ ranging from 0 to 16. In FIG. 14, $\gamma=16$, while in FIG. 15, $\gamma=3$.

Other filter configurations are possible within the scope of this invention. These filters may be more or less complex than the preferred embodiment disclosed herein. This disclosure teaches the techniques used to minimize the circuitry needed to implement digital filters, and hence minimize the power dissipation and battery current.

Figure 16:
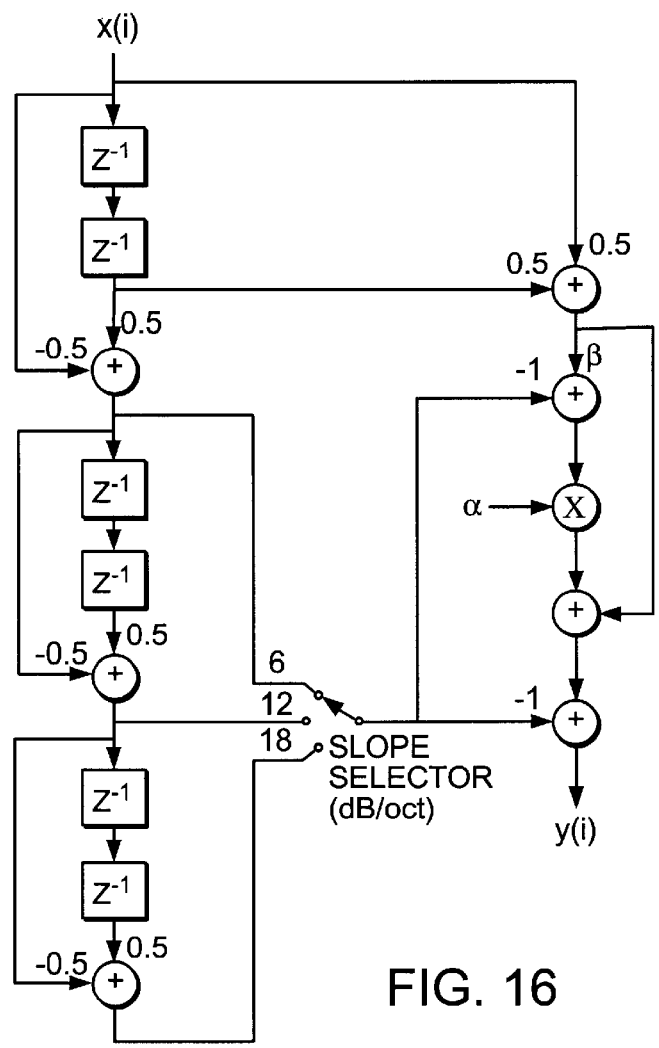
FIG. 16 is a block diagram of a most preferred embodiment of the invention.

FIG. 16 shows the block diagram of another preferred embodiment of the invention which uses less circuitry than the previous preferred embodiment, and therefore is more preferred. The signal processing utilized in FIG. 16 can be described in the z-domain as follows:

$$H(z)=(1+\alpha \cdot \beta) \cdot U(z)-(1+\alpha) \cdot V(z) \quad (8)$$

$$U(z)=0.5+0.5 \cdot z^{-2} \quad (9)$$

$$V(z)=(0.5-0.5 \cdot z^{-2})^n \quad (10)$$

where the parameters used are previously defined in connection with equation 1.

An estimate of the power dissipation for this preferred embodiment will now be made based on the circuit of FIG. 16. First an estimate of gate count is made for each functional element: delay register, adder, and multiplier. As before, based on an assumption that the width of the data is 20 bits, the gate counts are based on the gate counts of similar CD4000 series CMOS logic parts as follows:

Delay register—based on a CD4174 hex type D flip-flop. The CD4174 has an equivalent gate count of 43.5 gates, or 7.25 gates per bit. A 20-bit register then has 145 gates.

Adder—based on a CD4008 4-bit full adder. The CD4008 has an equivalent gate count of 40 gates. Therefore a 20-bit adder has 200 gates.

Multiplier—based on an array multiplier [A. Peled and B. Liu, *Digital Signal Processing, Theory, Design, and Implementation*, John Wiley & Sons Inc., New York, 1976; R. Higgins, *Digital Signal Processing in VLSI*, Prentice Hall, Englewood Cliffs, N.J., 1990], the number of equivalent gates for a n×m multiplier is estimated by $$gates = n*m + 10\left(2*\sum_{i=0}^{m-2} i + (n-m)*(m-1)+1\right) \text{ as in previous equation (6)}$$

where n and m are the number of bits for each of the multiplicands, n>m, and m≧2. Then, from equation (4), a 20-bit by 20-bit multiplier requires 4020 equivalent gates.

| Element | Gates | Quantity | Total gates in FIG. 16 Embodiment |
| --- | --- | --- | --- |
| Delay register | 145 | 6 | 870 |
| Adder | 200 | 7 | 1400 |
| Multiplier | 4020 | 1 | 4020 |
| | | | 6290 |

To estimate the power dissipation, an estimate of the dissipation per gate is needed. Low-voltage, low power CMOS processes have achieved power dissipation figures of 0.05µW/MHz/gate for 0.5-V MTCMOS [T. Douseki, S. Shigematsu, J. Yamada, M. Harada, H. Inokawa, and T. Tsuchia, A 0.5-V MTCMOS/SIMOX Logic Gate, *IEEE J. Solid-State Circuits*, vol. 32, no. 10, pp. 1604–1609, 1997]. Then for 1.3 volt operation, 0.34 µW/MHz/gate may be assumed. For the digital filter operating at a sampling rate of 32 kHz, the total power dissipation is given by $$P_{diss}=(0.34 \text{ µW/MHz/gate})\cdot(0.032 \text{ MHz})\cdot(6290 \text{ gates})=68.4 \text{ µW} \quad (11)$$

At a voltage of +1.3 volts, the battery current would be only 53 µA. This compares to a gate count of 8560 and a battery current of 72 µA for the FIG. 6 embodiment previously disclosed. Additional power savings can be obtained by using a 20×10 multiplier (20-bit data and 10-bit control signal) instead of the 20×20 multiplier. This would save about 2100 equivalent gates. From equation (11), the power dissipation is calculated and is 45.6 µW. At 1.3 V this would be a battery current of only 35 µA. As demonstrated, this filter configuration consumes very low power levels from the battery.

Frequency response of preferred embodiment of FIG. 16: The frequency response of the preferred digital filter described by equation (8) through (10) depends on parameters $\alpha$, $\beta$, and n. The $\alpha$ parameter controls the high-frequency gain of the filter. The $\beta$ parameter controls the low-frequency gain relative to the high-frequency gain. Finally, the n parameter selects a maximum nominal slope of 6, 12, or 18 dB/oct. FIGS. 17–23 show typical frequency responses that can be achieved by varying the different parameters.

Figure 17:
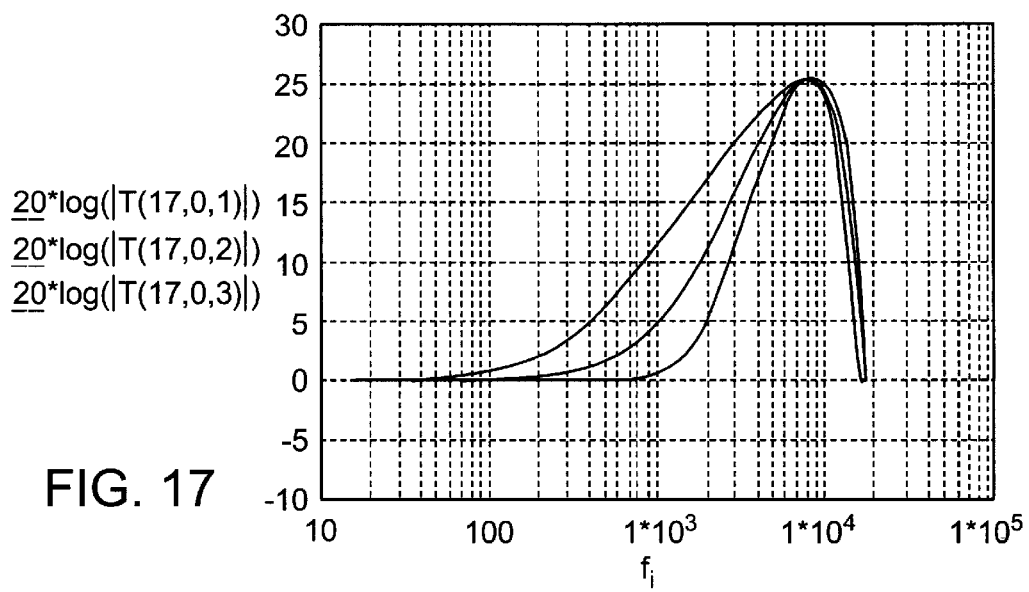
FIG. 17 is a plot of a family of frequency response curves for α=17, β=0 and η=1.

FIG. 17 shows the effect of selecting different slopes. A family of frequency response curves for $\alpha=17$, $\beta=0$, and n=1, is shown. The peak gain is set by $\alpha=17$ and is about 24 dB regardless of the selected slope. The low frequency gain is 0 dB (i.e., unity gain) and is set by setting $\beta$ to zero. Above 8 kHz the gain is decreases from the peak gain of 25 dB to 0 dB at 16 kHz to minimize high-frequency noise for hearing aid applications.

Figure 18:
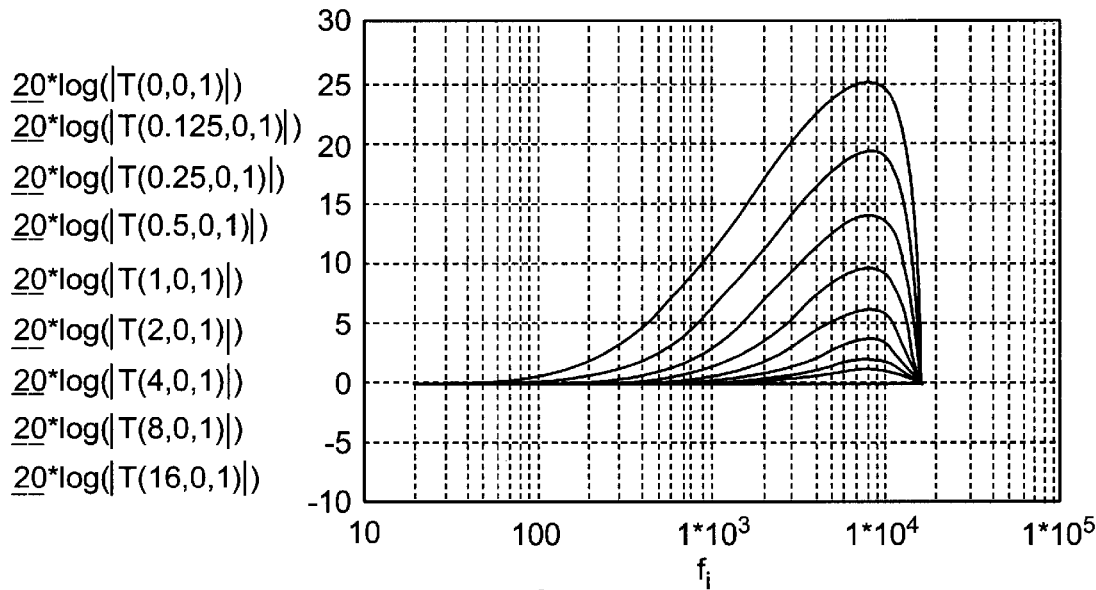
FIG. 18 is a plot of a family of frequency response curves for η=1, β=0 and α ranging from 0 to 16.

FIG. 18 shows a family of frequency response curves for n=1, $\beta=0$, and $\alpha$ ranging from 0 to 16. For high-level signals (i.e., loud sounds), $\alpha$ would be driven towards zero and the frequency response becomes flat. For low-level signals (i.e., soft sounds), $\alpha$ increases towards 16 and the high frequency gain also increases. Since $\beta$ is set to 0, there is no low-frequency amplification.

Figure 19:
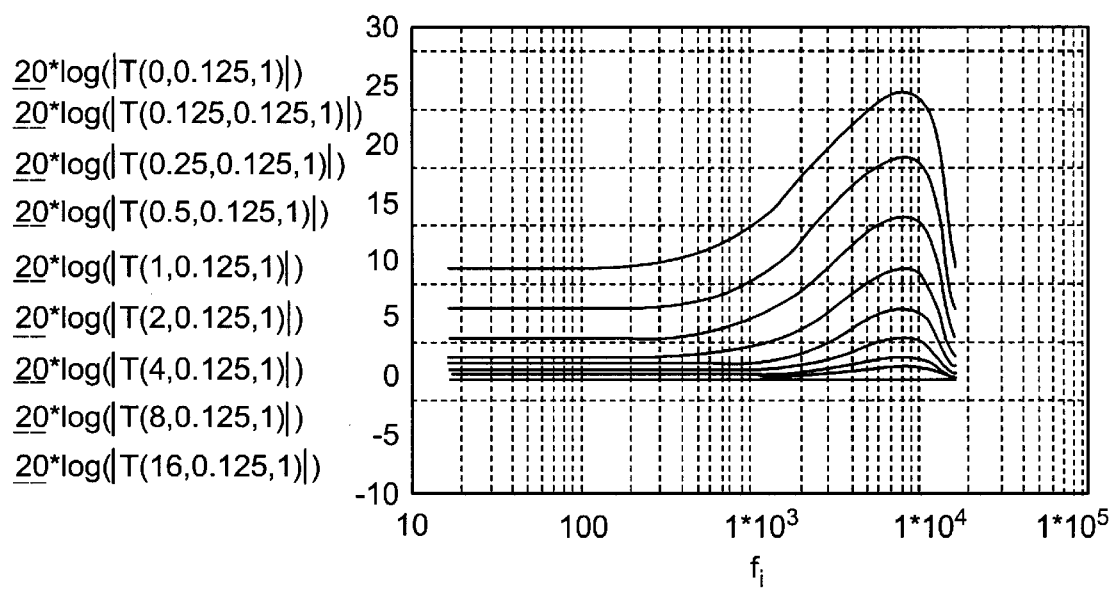
FIG. 19 is a plot of a family of frequency response curves for β=0.125 and α ranging from 0 to 16.
Figure 20:
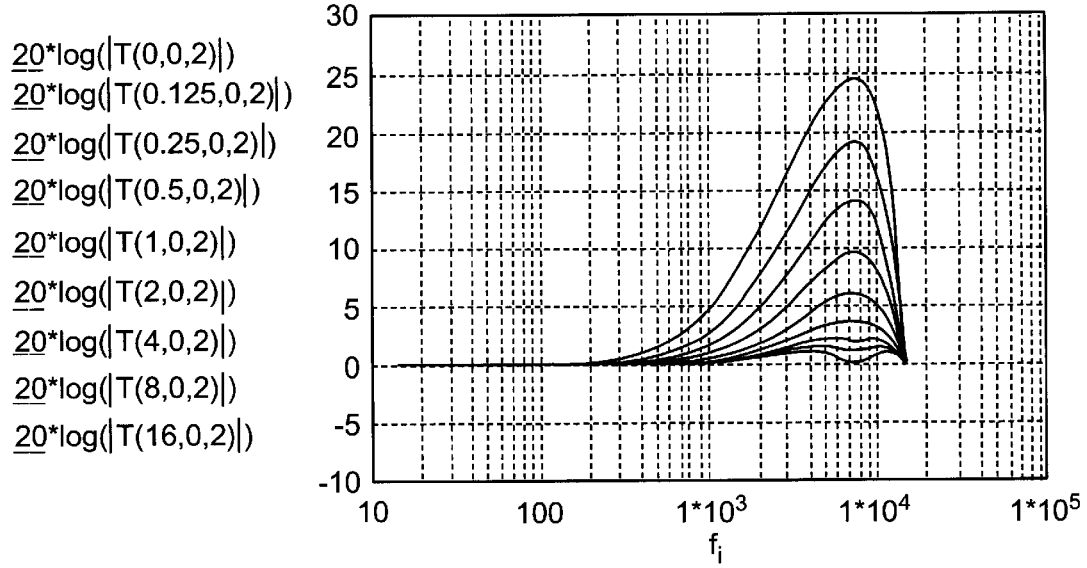
FIG. 20 is a plot of a family of frequency response curves for η=2, β=0 and α ranging from 0 to 16.
Figure 21:
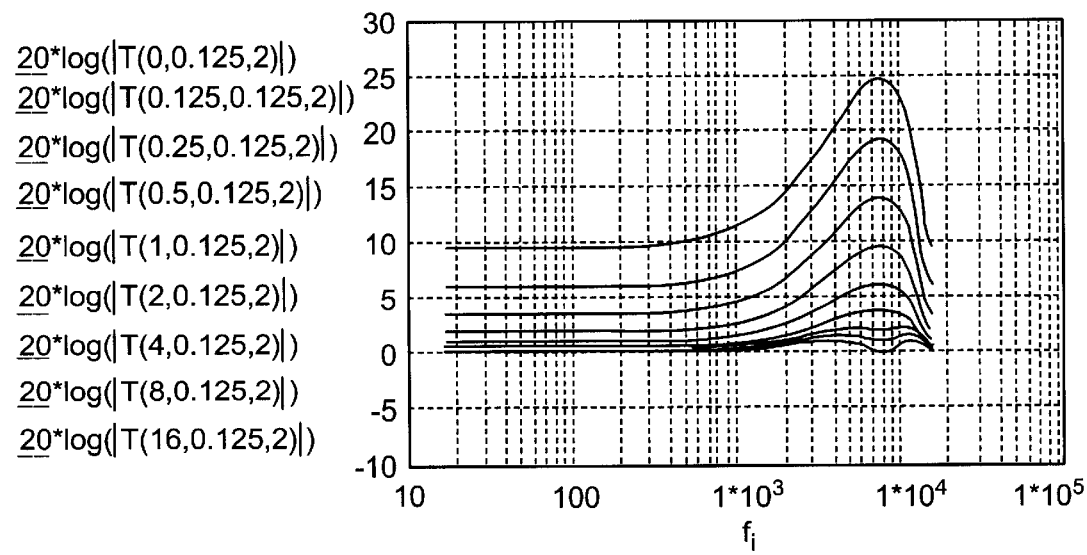
FIG. 21 is a plot of a family of frequency response curves for η=2, β=0.125 and α ranging from 0 to 16.
Figure 22:
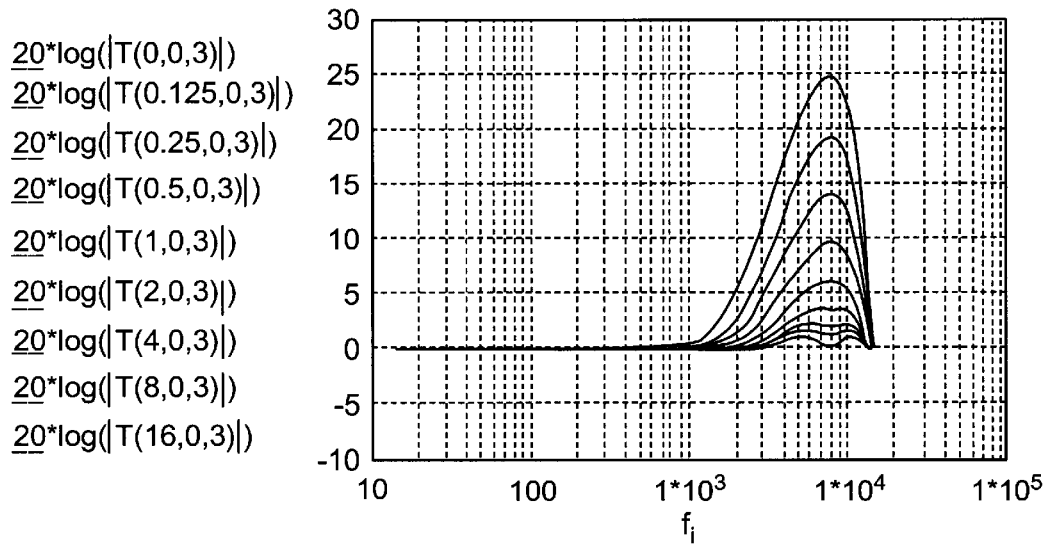
FIG. 22 is a plot of a family of frequency response curves for η=3, β=0 and α ranging from 0 to 16.
Figure 23:
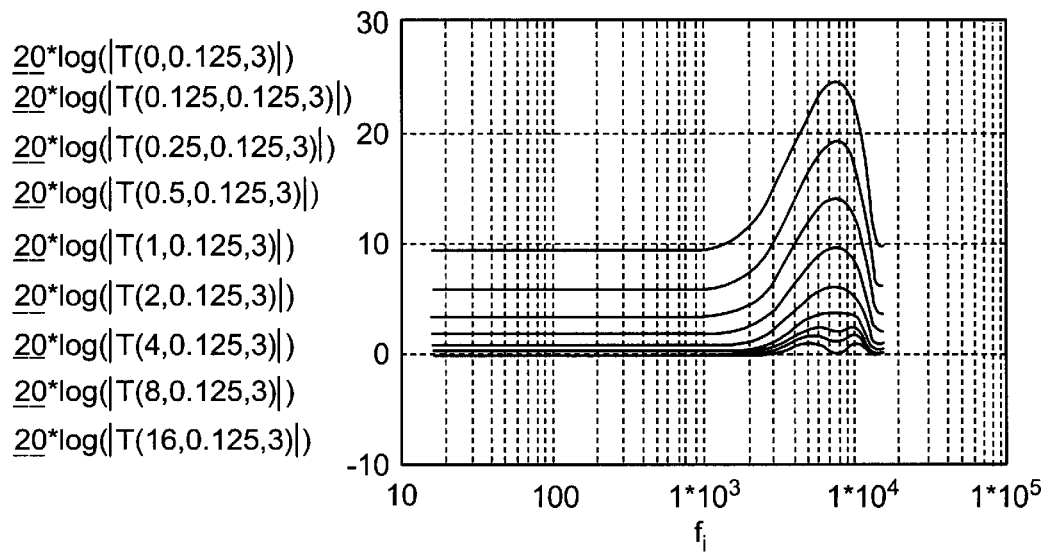
FIG. 23 is a plot of a family of frequency response curves for η=3, β=0.125 and α ranging from 0 to 16.

FIG. 19 shows the same filter used for FIG. 18 except $\beta=0.125$. Now as $\alpha$ increases towards 16, the gain at low frequencies also increases, although not as much as the gain at high-frequencies.

FIGS. 20–23 show the frequency response for n=2 and 3 with $\beta=0.125$, as $\alpha$ ranges from 0 to 16.

Equivalents

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A system for processing digital signals of a hearing aid device, the system comprising:

an audio input signal representative of a sound level;

a digital filter for processing the audio input signal, the digital filter including coefficient multipliers to provide selective weighting of discrete components derived from the input signal at stages of the digital filter, the coefficient multipliers supporting coefficient multiplication via bit-shifting to produce selected weights of corresponding discrete components at stages of the digital filter; and an output of the digital filter, the output depending at least in part on the coefficient multiplication of components at corresponding stages of the digital filter, at least one stage of the digital filter including a multiplier circuit, a selected multiplicand input of the multiplier circuit controlling a corresponding frequency response such that the digital filter provides a frequency response about that provided by transfer function $H(z)=-z^{-2}+\lambda (-2^{-\gamma}z^{-2}+G(z)^S)$, where $G(z)=(0.5+0.5 \ z^{-1}+0.125z^{-2})(1+0.25z^{-1})(1-z^{-1})$, and where $\gamma$ controls the magnitude of the frequency response at a higher frequency range, and $\gamma$ controls the magnitude of the frequency response at lower frequency range, and S selects a slope of the frequency response between the high and low frequency ranges.

2. A method for processing digital signals of a hearing aid device, the method comprising:

receiving an audio input signal representative of a sound level;

processing the audio input signal using a digital filter, the digital filter including coefficient multipliers to provide selective weighting of discrete components derived from the input signal at stages of the digital filter;

supporting coefficient multiplication via bit-shifting to produce selected weights of corresponding discrete components at stages of the digital filter; and producing an output of the digital filter, the output depending at least in part on the coefficient multiplication of the discrete components at corresponding stages of the digital filter, the digital filter providing a frequency response about that provided by transfer function $H(z)=(1+\alpha\beta) \ U(z)-(1+\alpha) \ V(z)$, where $U(z)=(0.5+0.5 \ z^{-2})$, $V(z)=(0.5-0.5 \ z^{-2})^n$, and where a controls the magnitude of the frequency response at a higher frequency range, and $\beta$ controls the magnitude of the frequency response at lower frequency range, and n selects a slope of the frequency response between the high and low frequency ranges.

3. A method for processing digital signals of a hearing aid device, the method comprising:

receiving an audio input signal representative of a sound level;

processing the audio input signal using a digital filter, the digital filter including coefficient multipliers to provide selective weighting of discrete components derived from the input signal at stages of the digital filter;

supporting coefficient multiplication via bit-shifting to produce selected weights of corresponding discrete components at stages of the digital filter; and producing an output of the digital filter, the output depending at least in part on the coefficient multiplication of the discrete components at corresponding stages of the digital filter, the digital filter providing a frequency response about that provided by transfer function $H(z) = -z^{-2} + \lambda(-2^{-\gamma}z^{-2} + G(Z)^S)$, where $G(z) = (0.5 + 0.5\ z^{-1} + 0.125\ z^{-2})(1 + 0.25z^{-1})(1 - z^{-1})$, and where $\lambda$ controls the magnitude of the frequency response at a higher frequency range, and $\gamma$ controls the magnitude of the frequency response at lower frequency range, and S selects a slope of the frequency response between the high and low frequency ranges.

* * * * *

UNITED STATES PATENT AND TRADEMARK OFFICE
CERTIFICATE OF CORRECTION

PATENT NO. : 6,292,571 B1
DATED : September 18, 2001
INVENTOR(S) : Walter P. Sjursen It is certified that error appears in the above-identified patent and that said Letters Patent is hereby corrected as shown below:

Column 12,
Line 26, replace "where $\gamma$ controls" with -- where $\lambda$ controls --.
Line 49, replace "where a controls" with -- where $\alpha$ controls --.

Column 13,
Line 6, replace "$G(Z)^S$" with -- $G(z)^S$ --.

Signed and Sealed this

Twenty-ninth Day of April, 2003

JAMES E. ROGAN
*Director of the United States Patent and Trademark Office*